United States Patent [19]

Inaike et al.

[11] Patent Number: 4,528,833
[45] Date of Patent: Jul. 16, 1985

[54] METHOD FOR REMOVAL OF CURLING OF CIRCUIT PRINTABLE FLEXIBLE SUBSTRATE

[75] Inventors: Toshihiro Inaike, Chiba; Katsuhiko Ushimi; Toshihiro Inoue, both of Ichihara, all of Japan

[73] Assignee: UBE Industries, Ltd., Yamaguchi, Japan

[21] Appl. No.: 517,799

[22] Filed: Jul. 27, 1983

[30] Foreign Application Priority Data

Jul. 29, 1982 [JP] Japan .................. 57-131307
Jul. 29, 1982 [JP] Japan .................. 57-131308
Nov. 2, 1982 [JP] Japan .................. 57-191760

[51] Int. Cl.³ .................. B21D 1/00; B21D 1/02
[52] U.S. Cl. .................. 72/166; 493/459;
427/172; 264/280; 29/829; 72/160
[58] Field of Search .................. 72/46, 166, 160, 183,
72/378; 29/829; 427/172; 264/280; 493/459, 440, 439

[56] References Cited

U.S. PATENT DOCUMENTS

| | | | |
|---|---|---|---|
| 1,048,793 | 12/1912 | Beeman et al. | 72/183 |
| 2,383,964 | 9/1945 | Grupe | 427/172 |
| 2,653,643 | 9/1953 | Miller et al. | 72/166 |
| 2,750,984 | 6/1956 | Miller et al. | 72/183 |
| 3,076,492 | 2/1963 | Monks | 72/160 |
| 3,461,703 | 8/1969 | Ranney | 72/183 |
| 3,590,620 | 7/1971 | Lowery | 72/166 |
| 3,954,570 | 5/1976 | Shirk et al. | 204/15 |
| 4,035,694 | 7/1977 | Barton et al. | 361/400 |
| 4,353,954 | 10/1982 | Yamaoka et al. | 428/216 |
| 4,360,356 | 11/1982 | Hall | 493/459 |

OTHER PUBLICATIONS

Derwent Abstract Publication 02339c/02, 02/21/78, Abstract for Japan 54, (1979)-111673.
Derwent Abstract Publication 72675b/40, 02/13/78, Abstract for Japan 54, (1979)-108272.
Derwent Abstract Publication 51354/28, 11/07/77, Abstract for Japan 54, (1979)-66966.
Derwent Abstract Publication 29952d/17, 08/03/79, Abstract for Japan 56, (1981)-23791.
Derwent Abstract Publication 12535d/08, 05/31/79, Abstract for Japan 55, (1980)-160489.
Derwent Abstract Publication 30398b/16, 08/12/77, Abstract for Japan 54, (1979)-31480.
Derwent Abstract Publication 50478c/29, 11/25/78, Abstract for Japan 55, (1980)-72095.

Primary Examiner—Daniel C. Crane
Attorney, Agent, or Firm—Frishauf, Holtz Goodman & Woodward

[57] ABSTRACT

A method for removal of curling of a circuit printable flexible substrate comprising a metal foil and a film layer of an aromatic polyamideimide or an aromatic polyimide formed by coating on the said metal foil a solution of an aromatic polyamideimide, an aromatic polyimide precursor or an aromatic polyimide, and drying the coated solution layer to setting, whose curling is produced to direct the metal foil surface to face outside, which comprises sliding under tension the curled circuit printable flexible substrate on a curved surface of a bar having a curvature radius of 0.5–25 mm, at which the substrate is turned back at a turning angle of not less than 90°, placing the metal foil layer in contact with the bar, at a temperature of not higher than 80° C. A method employing two such bars is also disclosed.

23 Claims, 1 Drawing Figure

METHOD FOR REMOVAL OF CURLING OF CIRCUIT PRINTABLE FLEXIBLE SUBSTRATE

BACKGROUND OF THE INVENTION

1. Field of the Invention

This invention relates to a method for removing curling of a circuit printable flexible substrate.

More particularly, this invention relates to a method for mechanically removing curling occurring on a circuit printable flexible substrate comprising a metal foil and a film layer of an aromatic polyamideimide or polyimide provided thereon. Further, this invention relates to a method appropriately employable for mechanically and continuously removing curling occurring on a circuit printable continuous flexible substrate comprising a metal foil and a film layer of an aromatic polyamideimide or polyimide provided thereon.

2. Description of Prior Arts

A circuit printable flexible substrate is a substrate comprising a metal foil such as a copper foil and a resin film provided on the metal foil. Such a circuit printable flexible substrate has been recently widely utilized as a wiring substrate for preparing a flexible printed circuit so as to obtain a simplified or highly integrated electronic circuit. Particularly, a circuit printable flexible substrate comprising a metal foil and a film layer of an aromatic polyamideimide or polyimide provided thereon has been mainly utilized because the aromatic polyamideimide and polyimide have excellent properties as a material for forming a resin film of the substrate.

A circuit printable flexible substrate comprising a metal foil and a resin film of the above-mentioned aromatic polyamideimide or polyimide can be manufactured by the following methods:

(1) A method comprising combining a metal foil and a film of an aromatic polyamideimide or polyimide with an adhesive under pressure and heating, and (2) A method wherein a substrate comprising a metal foil and an aromatic polyamideimide or polyimide is manufactured without using an adhesive. More specifically, this method can be carried out by coating on the said metal foil a solution of an aromatic polyamideimide, an aromatic polyimide precursor or an aromatic polyimide, and then drying the coated solution layer to to cause it to set.

The above-mentioned method (1) has been generally employed. In this method, an adhesive layer of 10–30 μm thick is provided between the metal foil and the aromatic polyamideimide or polyimide film. However, it is known that resins generally used for forming the adhesive layer are noticeably inferior to the aromatic polyamideimide and polyimide in such properties as heat resistance, electric property, resistance to chemicals, and mechanical property. Accordingly, the properties of a circuit printable flexible substrate prepared in the method (1) are necessarily defined by the properties of the adhesive resin. For this reason, advantageous features brought about by using the film material of an aromatic polyamideimide or polyimide having excellent properties for the preparation of the insulating layer are not made the best use of.

On the other hand, the method (2) is advantageously simple, and there is no need of utilizing an adhesive layer. Accordingly, the excellent properties of the aromatic polyamideimide or polyimide also become the advantageous properties of the product substrate. A further advantage is that the adhesion between the metal foil and the aromatic polyamideimide or polyimide film layer is not deteriorated at high temperatures. However, a circuit printable flexible substrate manufactured according to this method (2) has a problem of occurrence of curling caused by shrinkage of the volume of the resin film layer. More specifically, in the stage for drying a resin layer of an aromatic polyamideimide or polyimide solution coated on a metal foil, the volume shrinkage of the film layer takes place as a result of evaporation of the solvent, and this volume shrinkage brings about the unfavorable curling. Particularly, in the method wherein a solution of an aromatic polyimide precursor such as an aromatic polyamic acid is coated on a metal foil and heated to give a polyimide film layer through evaporation of the solvent and ring formation of the polyamic acid, both shrinkage by evaporation of the solvent and the volume shrinkable by the ring formation reaction take place, thereby bringing about heavy curling. Furthermore, it is known that the difference of linear expansion coefficient between the resinous material forming the film layer and the metal foil accelerates the occurrence of curling.

The occurrence of such curling is fatally defective for a circuit printable flexible substrate, because such curling causes inconvenience in the course of a screen printing process, a chemical etching process and the like to the substrate. Futher, the so produced curling sometimes causes formation of cracks on a resist and problems such as cutting and formation of short circuit of a conductor.

Accordingly, there have been proposed many improvements for preventing or reducing occurrence of the curling.

For example, as a method for preventing occurrence of curling in the case where an aromatic polyimide film layer which is most suitable for a circuit printable flexible substrate is formed on a metal foil, there has been proposed a method employing a partially ring-closed aromatic polyimide precursor so as to decrease the volume shrinkage, as well as a method wherein the volume shrinkage caused by the ring closing reaction is prevented by coating an aromatic polyimide of a solvent-soluble type. However, even in these improved methods, there still remains a problem of curling occurring in the stage for evaporating the solvent, as well as occurring due to the difference in the linear expansion coefficient between the resinous material and the metal foil. In the case where an aromatic polyamideimide film is formed on a metal foil, the volume shrinkage produced by ring closing reaction hardly occurs, while the curling caused in the stage of evaporation of the solvent and the difference in the linear exapantion coefficient between the metal foil and the resinous material still occurs.

Alternatively, a method for removing curling occurring on a manufactured substrate is known.

Examples of such methods include:

a method wherein a curled substrate is heated to a high temperature for a long time, thereby removing the distortion, as disclosed in Japanese Patent Provisional Publication No. 54(1979)-66966;

a method wherein a curled substrate is wound around a cylinder having a diameter of 70–1,000 mm, placing the surface opposite to the curled face (that is the surface of a metal foil) inside, and then allowing it to stand for a long time at a high temperature, thereby removing the curling, as disclosed in Japanese Patent Provisional Publications No. 54(1979)-108272, No. 54(1979)-111673 and No. 55(1980)-72095; and a method wherein a curled substrate is wound around a cylinder in the same manner as described above and is allowed to stand in an organic solvent at a high temperature for a long time, thereby removing the curling, as disclosed in Japanese Patent Provisional Publications No. 55(1980)-160489 and No. 56(1981)-23791.

However, since these methods all require a heat treatment at a high temperature for a long time, they are not suitable for removing curling particularly occurring on a circuit printable continuous flexible substrate. Further, a substrate processed by the method comprising a heat treatment in an organic solvent sometimes contains, undesirably, a solvent introduced in the processing.

Methods for removing curling occurring specifically on a circuit printable continuous flexible substrate have been known. As an example, there can be cited a method wherein a metal foil of a curled substrate is bent while heated around a dryer having a curved surface suce as a drum dryer, and then drawn or rolled in the bended direction (MD direction), thereby decreasing curling, as disclosed in Japanese Patent Provisional Publication No. 54(1979)-31480. According to this method, however, since the substrate is drawn or rolled at such a high temperature so as to soften the resin layer, for example, at a high temperature in the vicinity of the glass transition temperature or higher than 100° C. in the presence of a solvent, both the resin film layer and metal foil suffer plastic deformation. Accordingly, this method is defective in that the process is complicated, a pin hole is apt to be produced on a resin film layer, and that curling is apt to reoccur after completion of the curling removal processing, as a result of the difference in linear expansion coefficient between the resin film layer and the metal foil, or spontaneous removal of the remaining solvent.

SUMMARY OF THE INVENTION

Accordingly, a primary object of the present invention is to provide a method for removing, effectively and with simple procedure, curling produced on a circuit printable flexible substrate comprising a metal foil in various kinds of forms such as continuous, rectangle, square, polygon, circle and oval and a film layer of an aromatic polyamideimide or polyimide provided on the metal foil.

Another object of the invention is to provide a method for removing, effectively and with simple procedure, curling produced on a circuit printable continuous flexible substrate comprising a continuous metal foil and a film layer of an aromatic polyamideimide or polyimide provided on the metal foil.

A further object of the invention is to provide a method for continuously removing curling produced apparently or latently on a circuit printable continuous flexible substrate in the longitudinal direction (MD direction) of the substrate and/or the width direction (TD direction).

There is provided by the present invention a method for removal of curling of a circuit printable flexible substrate comprising a metal foil and a film layer of an aromatic polyamideimide or an aromatic polyimide formed by coating on the said metal foil a solution of an aromatic polyamideimide, an aromatic polyimide precursor or an aromatic polyimide, and drying the coated solution layer to cause it to set, whose curling is produced to direct the metal foil surface to face outside, which comprises sliding under tension the curled circuit printable flexible substrate on a curved surface of a bar having a curvature radius of 0.5–25 mm, at which the substrate is turned back at a turning angle of not less than 90°, placing the metal foil layer in contact with the bar, at a temperature of not higher than 80° C.

Also provided by the present invention is a method for removal of curling of a circuit printable continuous flexible substrate comprising a metal foil and a film layer of an aromatic polyamideimide or an aromatic polyimide formed by coating on the said metal foil a solution of an aromatic polyamideimide, an aromatic polyimide precursor or an aromatic polyimide, and drying the coated solution layer to cause it to set, whose curling is produced to direct the metal foil surface to face outside, which comprises:

a stage of sliding under tension the curled circuit printable continuous flexible substrate in the longitudinal direction, on a curved surface of a first bar having a curvature radius of 0.5–25 mm which is so arranged as to make an angle of 20°–70° against the width direction of the above continuous substrate supplied and at which the substrate is turned back at a turning angle of not less than 90°, placing the metal foil layer in contact with the first bar, at a temperature of not higher than 80° C.; and a stage of sliding under tension the so processed continuous flexible substrate in the longitudinal direction on a curved surface of a second bar having a curvature radius of 0.5–25 mm which is so arranged as to make an angle of 70°–110° against the first bar, at which the substrate is turned back at a turning angle of not less than 90°, placing the metal foil layer in contact with the second bar, at a temperature of not higher than 80° C. If necessary, this embodiment is specifically termed herein "the second embodiment". The method for removing curling according to the invention is capable of effectively removing curling with little plastic deformation of the resin film layer, though the metal foil suffers little and negligible plastic deformation. Accordingly, deterioration in quality of a circuit printable flexible substrate inevitably caused by the conventional methods for removing curling which comprises a heat treatment under a high temperature is not substantially brought about.

Since the method for removing curling in the present invention is carried out at a relatively low temperature, the so processed circuit printable flexible substrate is excellent in stability, and curling hardly reoccurs when the substrate is cooled afterward to room temperature or heated to a high temperature.

Moreover, the curling apparently or latently produced on a circuit printable continuous flexible substrate in the longitudinal direction (MD direction) of the substrate and/or the width direction (TD direction) can be continuously and effectively removed particularly according to the second embodiment comprising the two stage processing.

Figure 1:
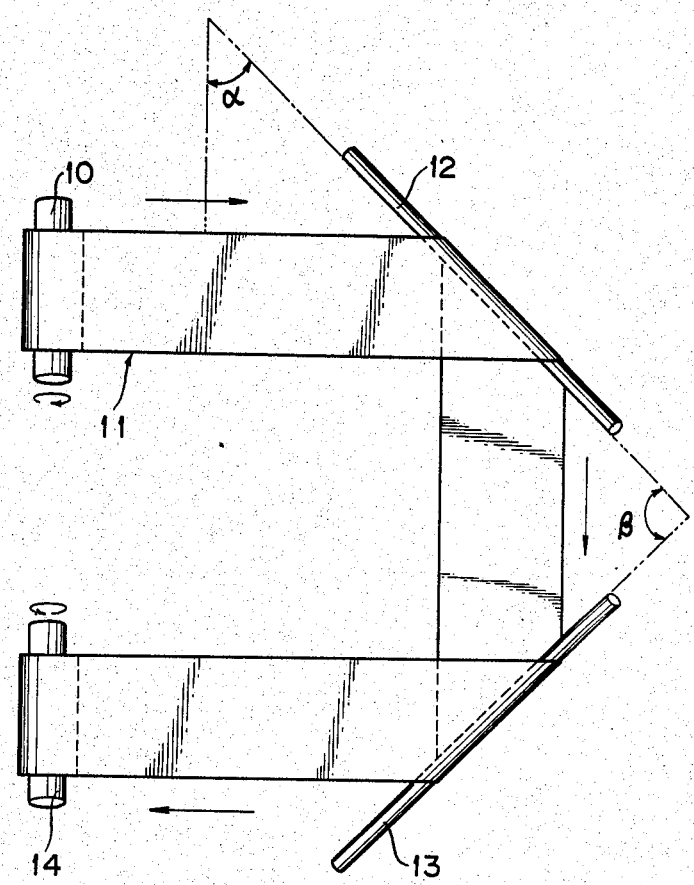
FIG. 1 is a schematic plane view showing an apparatus for carrying out a method for removing curling of a circuit printable continuous flexible substrate according to the second embodiment of the invention.

10: roll for supplying circuit printable continuous flexible substrate;
11: circuit printable continuous flexible substrate;
12: first bar;
13: second bar; and
14: roll for winding up circuit printable flexible substrate.

DESCRIPTION OF PREFERRED EMBODIMENTS

A circuit printable flexible substrate to be processed according to the method of the present invention for removing curling is a substrate comprising a metal foil in various shapes and a film layer of an aromatic polyamideimide or polyimide provided on the said metal foil by coating on the same metal foil a solution of an aromatic polyamideimide, an aromatic polyimide precursor or an aromatic polyimide, and drying the coated solution layer to cause it to set. As described above, a circuit printable flexible substrate manufactured by the above method is apt to suffer curling, being so formed as to direct the metal foil surface to face outside.

Representative examples of the aromatic polyamideimide employable for the present invention include polymers having a recurring unit represented by the following formula (I) or (II):

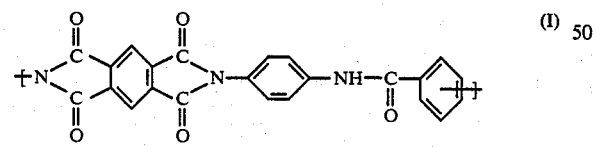

(I)

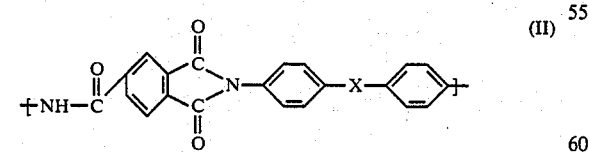

(II)

wherein X represents a divalent atom or divalent group such as —CH$_2$—, —O—, —S—, —CO—, —SO$_2$— and —SO—.

The aromatic polyamideimide employable for the invention is not limited to a polymer having the recurring unit represented by the formula (I) or (II). Accordingly, any other aromatic polyamideimides containing in the molecule an amide group as well as an imide group as the recurring groups can be also employed. The aromatic polyamideimide can be employed alone or in mixture of two or more kinds of aromatic polyamideimides.

The solvent for preparing a coating solution of the aromatic polyamideimide can be selected from various kinds of known solvents. Amide-type solvents such as N,N-dimethylformamide and N-methyl-2-pyrrolidone are preferred.

In the present invention, examples of the aromatic polyimide precursor include:
a polymer having a recurring unit represented by the following formula (III), which can be prepared by the reaction between an aromatic diamine and pyromellitic acid dianhydride;
a polymer having a recurring unit represented by the following formula (IV), which can be prepared by the reaction between an aromatic diamine and 3,3',4,4'-benzophenonetetracarboxylic acid anhydride;
a polymer having a recurring unit represented by the following formula (V), which can be prepared by the reaction between an aromatic diamine and 3,3',4,4'-biphenyltetracarboxylic acid dianhydride; and
partially ring closed derivatives of the above-mentioned polymers:

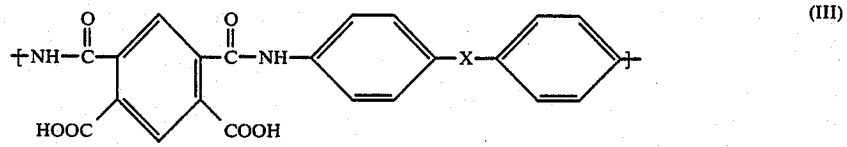

(III)

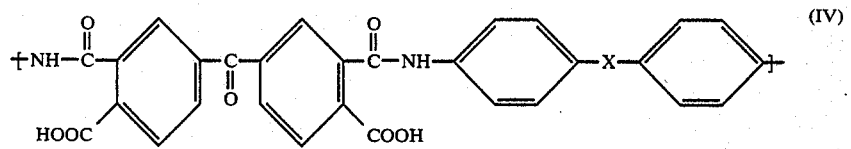

(IV)

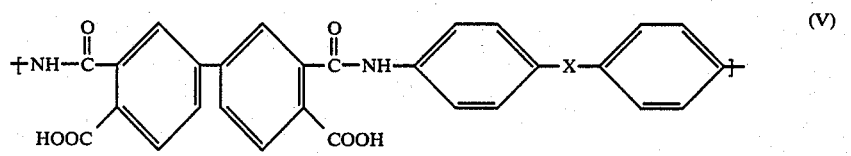

(V)

wherein
X represents a divalent atom or divalent group such as —CH$_2$—, —O—, —S—, —CO—, —SO$_2$— and —SO—.

Taking properties of the produced polyimide into consideration, it is preferred that the aromatic diamine used for preparing the above-mentioned polymers is a symmetric aromatic diamine having no substituent, which is represented by the formula (VIII):

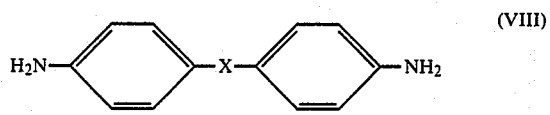

(VIII)

wherein X represents a divalent atom or divalent group such as —CH$_2$—, —O—, —S—, —CO—, —SO$_2$— and —SO—.

Examples of the preferred aromatic diamine include 4,4'-diaminodiphenylmethane, 4,4'-diaminodiphenyl ether, 4,4'-diaminodiphenyl thioether and 4,4'-diaminodiphenylsulfone.

Symmetric diamines such as p-phenylenediamine other than those represented by the above formula (VIII) can be also employed.

Aromatic diamines such as 3,3'-dimethyl-4,4'-diaminodiphenylmethane, 3,3'-diaminodiphenyl ether, 2,4-diaminotoluene and m-phenylenediamine which are conventionally employed for rendering an aromatic polyimide soluble in a solvent can be also employed.

The aromatic polyimide precursor employable in the invention is not limited to polymers having the recurring unit represented by the above formula (III), (IV) or (V).

The aromatic polyimide precursor can be employed alone or in mixture of two or more kids of aromatic polyimide precursors.

The solvent for preparing a coating solution of the aromatic polyimide precursor can be selected from various kinds of known solvents. Amide-type solvents such as N,N-dimethylformamide and N-methyl-2-pyrrolidone are preferred.

In the present invention, examples of the aromatic polyimide include:
  a polymer having a recurring unit represented by the following formula (VI), which can be prepared by the reaction between an aromatic diamine and 3,3',4,4'-benzophenonetetracarboxylic acid dianhydride; and,
  a polymer having a recurring unit represented by the following formula (VII), which can be prepared by the reaction between an aromatic diamine and 3,3',4,4'-biphenyltetracarboxylic acid dianhydride:

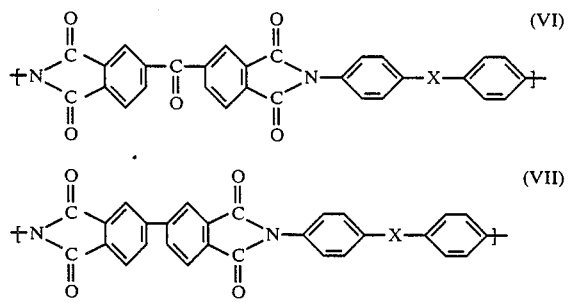

wherein
  X represents a divalent atom or divalent group such as —$CH_2$—, —O—, —S—, —CO—, —$SO_2$— and —SO—.

Taking the properties of the polyimide into consideration, the aromatic diamine employed for preparing the above compounds preferably is a symmetric aromatic diamine having no substituent, which is represented by the aforementioned formula (VIII).

The aromatic polyimide employable in the invention is not limited to polymers having the recurring unit represented by the above formula (VI) or (VII). For example, a compound haing a tetracarboxylic acid component of 2,3',3,4'-biphenyltetracarboxylic acid dianhydride can be employed. Further, various kinds of tetracarboxylic acid components described above can be incorporated into one molecule. The aromatic polyimide can be employed alone or in mixture of two or more kinds of aromatic polyimides.

The solvent for preparing an aromatic polyimide coating solution can be selected from the known solvents such as phenol-type solvents. Preferred are various halogenated phenol solvents, and particularly preferred is 4-chlorophenol.

A metal foil of a circuit printable flexible substrate employed in the present invention can be selected from metal foils which are in various kinds of forms and are made of metallic materials conventionally employed or proposed to use as materials therefor. A copper foil is generally employed. Particularly, an electrolytic copper foil, the surface of which is roughened, is preferred.

Also preferred are an electrolytic copper foil or a rolled copper foil being subjected to an annealing and recrystallizing process. The annealing and recrystallizing process can be carried out by heating a rolled copper foil to 200°–400° C. for 10–60 min. or heating an electrolytic copper foil to at 450°–600° C. for 30–60 min. Particularly preferred is a rolled copper foil annealed and recrystallized, because the process for annealing and recrystallizing the rolled copper foil can be done at a relatively low temperature. Accordingly, the annealing and recrystallizing process can be applied to a rolled copper foil in a process for the preparation of the aromatic polyamideimide or polyimide film on the foil.

Metal foils of other electro-conductive metallic materials such as aluminum foil and nickel foil can be also employed.

The thickness of metal foil generally ranges from 10 to 100 μm.

The process for coating the surface of the above metal foil with a coating solution of the aromatic polyamideimide, aromatic polyimide precursor or aromatic polyimide can be carried out, for example, by the procedure described below.

The polymer solution containing 5–30% by weight of the polymer is continuously extruded from a slit to form a film layer of even thickness on a surface of a metal foil. The coating conditions are generally adjusted to give the film layer a thickness ranging from 100 to 1,000 μm. Other coating means such as roll coater, knife coater, doctor blade and flow coater can be also employed.

Subseqently, the so coated polymer layer is heated to remove the solvent. In the case where an aromatic polyimide precursor such as an aromatic polyamic acid is employed as the polymer, the precursor is subjected, after removal of the solvent, to a ring closing reaction to convert into polyimide on the metal foil.

The process for heating the coated layer can be carried out under optionally determined conditions such as normal, reduced or elevated pressures. If the coated layer is heated to a high temperature before a thin polymer film is produced on the surface of the coated layer, the solvent evaporates so rapidly that the surface of the film layer is apt to become rough. Therefore, it is desired to heat the solution layer at a relatively low temperature in the early stage of the heating process. Then, the temperature is gradually raised to finally reach 150°–400° C. to remove the solvent completely (and to complete the ring closure, if the aromatic polyimide precursor is employed). The thickness of thus formed aromatic polyamideimide layer or aromatic polyimide layer generally ranges from 10 to 150 μm.

On the circuit printable flexible substrate manufactured as described above, curling is hardly observed in the direction in which the coating process is carried out (referred to herein as MD direction, which generally corresponds to the longitudinal direction), while heavy curling is observed in the direction vertical to MD direction (referred to herein as TD direction), this curling generally occurring with the surface of the metal foil outside. The term "curling" is used herein means curling observed and measured under the conditions in which the influence of the weight of the substrate as such is removed, for example, by hanging the substrate vertically.

Heavy curling observed on the circuit printable flexible substrate as described above can be effectively removed, that is, decreased or substantially eliminated by the method of the present invention.

The method for removing curling of the circuit printable flexible substrate of the invention is carried out by sliding the curled substrate on a curved surface (curvature radius: 0.5-25 mm) of a bar, at which the substrate is turned back at a turning angle of not less than 90°. In this sliding process, the curled substrate is applied to the bar under conditions that the metal foil surface is kept in contact with the bar under tension, at a temperature of not higher than 80° C. The substrate is run to slide in an optional direction, for example, in parallel to the curling direction, or in the direction vertical to the curling direction.

The bar having a curved surface whose curvature radius ranges from 0.5 to 25 mm employed in the invention is made of hard materials such as glass, ceramics, metal, resin and wood. The cross section of the bar (section in the vertical direction to the longitudinal direction of the bar) is circle or oval having curvature radius of 0.5-25 mm, or is in any shape of rectangle, square or polygon but the portion thereof where the matal foil is kept in contact has a curved surface having curvature radius of 0.5-25 mm. It is desired that the curvature radius of curved surface of the bar is within the range of 1-10 mm, and particularly within the range of 2-6 mm. The front surface of the bar (the portion where the substrate is kept in contact) can be so made as to have a little projected portion in the vicinity of the center. The length of the bar is set to be longer than the width of the substrate to be applied.

The method of the invention for removing the curling can be applied once to a curled substrate. Otherwise, the method for removing the curling can be applied to a curled substrate twice or more times in such a manner that the methods are applied in the same direction for each processing or in different directions for each processing.

The term "turning angle" employed herein means an angle formed between the imaginarily forwardly-elongated plane of the surface of substrate that is so supplied as to be kept in contact with the bar, and the surface of the substrate having been turned back at the bar. The turning angle preferably is not less than 135°. It is desired that the substrate takes a U-turn at the bar.

As described hereinbefore, the circuit printable flexible substrate is kept in contact with the curved surface of the bar, receiving tension. In order to apply tension to the substrate, a tensile force is supplied to the substrate. The level of the tensile force is determined depending on degree of curling of the substrate, nature of the material and thickness of the metal foil and resin film layer, and the curvature radius of the bar. The level of the tensile force is generally set within the range of 10-200 g., preferably 15-200 g., per 1 cm of the width of the substrate.

In the invention, there is no specific limitation on the speed at which the circuit printable flexible substrate slides on the curved surface of the bar. In the case where the substrate slides on the surface of the fixed bar, the sliding speed of the substrate is ordinarily adjusted to exceed 1 cm/min., preferably within 3-300 cm/min. In the case where the bar is so chosen to have a circular cross section and to rotate around its axis, the relative difference between the sliding speed of the substrate and the rotating speed of the bar (surface speed) is adjusted to be within the above range.

The method of the invention is carried out at a temperature of not higher than 80° C. It is possible to temporarily removing the curling at a temperature of higher than 80° C. However, a substrate processed at such a high temperature likely regains curling in the course of cooling the substrate to room temperature. Further, the resin film layer likely suffers plastic deformation when subjected to such a high temperature. The preferred temperature range for carrying out the method of the invention is 0°-50° C., and temperatures within 5°-40° C. are more preferred. It is particularly preferred to carry out the method at a temperature around room temperature, because the substrate processed at such a temperature is substantially free from reproduction of curling.

The method according to the second embodiment of the invention can effectively remove curling occurring specifically on a circuit printable continuous flexible substrate, in which the curling occurs in the longitudinal direction (MD direction) and/or the width direction (TD direction).

A circuit printable continuous flexible substrate is apt to suffer curling particularly in the width direction (TD direction), and curling usually is not observed in the longitudinal direction (MD direction) in the form of the continuous substrate. However, when the continuous substrate was cut so that the substrate is converted to be shorter in MD direction than in TD direction, curling is sometimes observed also in MD direction. Thus, it can be said that curling occurs latently in the longitudinal direction (MD direction) of the circuit printable continuous flexible substrate.

As described above, on the continuous substrate, heavy curling is hardly observed in the longitudinal direction, while heavy curling occurs in the width direction (TD direction) with the surface of the matal foil facing outside.

Both the heavy curling of the continuous substrate observed in TD direction and the latent curling in MD direction can be simultaneously removed by the method according to the second embodiment of the present invention comprising two combined stages.

In order to facilitate understanding of the second embodiment of the present invention, a detailed description is given below by referring to the attached drawing.

FIG. 1 is a schematic plane view showing an arrangement of the first and second bars in relation to the continuous substrate to be processed.

A continuous substrate 11 wound around a roll 10 moves in the direction shown by the attached arrow and is turned at a first bar 12 at a turning angle of 180° (in which the surface of the substrate supplied to the first bar 12 is in parallel with the surface of the substrate drawn from the first bar 12), placing the metal foil of the substrate in contact with the curved surface of the first bar 12. In FIG. 1, the first bar 12 is so arranged as to make an angle ($\alpha$) of 45° against the width direction of the continuous substrate. The continuous substrate drawn from the first bar 12 then moves in the direction shown by the attached arrow and is turned at a second bar 13 at a turning angle of 180° (in which the surface of the substrate supplied to the second bar 13 is in parallel with the surface of the substrate drawn from the second bar 13), placing the metal foil of the substrate in contact with the curved surface of the second bar 13. In FIG. 1, the second bar 13 is so arranged as to make an angle ($\beta$) of 90° against the first bar 12.

Generally, the first bar is so arranged as to make an angle of 20°–70° (this angle corresponding to $\alpha$ in FIG. 1) against the width direction of the continuous substrate (vertical to the direction in which the substrate moves). The angle $\alpha$ preferably is within the range from 40° to 50° and more preferably is approx. 45°. Further, it is preferred that the first bar is so arranged as to be placed substansially on the same plane as the roll for supplying the continuous substrate to the first bar.

The second bar generally is so arranged as to make an angle of 70°–110° (this angle corresponding to $\beta$ in FIG. 1) against the first bar. The angle $\beta$ preferably is within the range from 80° to 100° and more preferably is approx. 90°. Further, it is preferred that the second bar is so arranged as to be placed substansially on the same plane as the roll for receiving the continuous substrate drawn from the second bar.

As described above, the method of the present invention is effective to decrease or substantially eliminate curling occurring on a circuit printable flexible substrate comprising a metal foil and an aromatic polyamideimide or polyimide layer formed on the surface of the metal foil, and the procedure involved therein is so simple and no adhesive is required. Moreover, curling hardly reappeared on the substrate processed according to the method of the invention. Therefore, the method for removing curling of a circuit printable flexible substrate according to the invention is regarded particularly advantageous from the viewpoint of practical use. Particularly, the second embodiment of the invention is advantageously applied for removing curling occurring in the circuit printable continuous flexible substrate.

Examples embodying the present invetnion and comparison examples will be described below.

EXAMPLE 1

To 1146 g. of 4-chlorophenol were added 73.56 g. (0.25 mol.) of 3,3',4,4'-biphenyltetracarboxylic acid dianhydride and 50.06 g. (0.25 mol.) of 4,4'-diaminodiphenyl ether, and the mixture was heated under stirring to reach 160° C. for one hour. Subsequently, the resulting solution was kept at a temperature of 160° C. for one hour to carry out polymerization-imidization reaction to obtain an aromatic polyimide solution. The logarithmic viscosity of the produced aromatic polyimide was 2.28.

The aromatic polyimide solution was then casted on an electrolytic copper foil (MD direction: 24 cm×TD direction: 14 cm, thickness: 35 $\mu$m) at approx. 100° C., and heated to approx. 140° C. for one hour under reduced pressure to remove most of the solvent. The casted layer was subsequently heated to 300° C. to obtain a circuit printable flexible substrate having an aromatic polyimide film layer (thickness: 25 $\mu$m). The so obtained substrate had, in the TD direction, curling (curvature radius: 4.6 cm) which curled to direct the metal foil surface to face outside.

A process for removing the curling was carried out by placing a load of 506.5 g. at the end portion of the substrate, and sliding in the longitudinal direction (MD derection) the substrate on a curved surface (curvature radius: 4.0 mm) of a fixed bar made of glass, turning back the substrate at the bar at a turning angle of 180°. The sliding procedure was done at room temperature and at a running speed of 45 cm/min., placing the surface of copper foil in contact with the bar.

The substrate processed as above had curling of a curvature radius of 10.0 cm in TD direction, and thus the curling was apparently reduced. On the processed substrate was observed no curling in MD direction.

COMPARISON EXAMPLE 1

A circuit printable flexible substrate was prepared in the same manner as in Example 1. The so prepared substrate had a similar curling of a curvature radius of 5.0 cm in TD direction.

The process for removing curling described in Example 1 was repeated on the above substrate except that the load placed on the end portion of the substrate was replaced with a load of 2207 g. and that the bar was replaced with a glass bar having a curved surface of a curvature radius of 30 mm.

The substrate processed as above had curling of a curvature radius of 5.1 cm in TD direction, and thus no substantial change was observed.

EXAMPLE 2

A circuit printable flexible substrate was prepared in the same manner as in Example 1. The so prepared substrate had a similar curling of a curvature radius of 4.7 cm in TD direction.

The process for removing curling described in Example 1 was repeated on the above substrate except that the bar was replaced with a glass bar having a curved surface of a curvature radius of 6.2 mm.

The substrate processed as above had curling of a curvature radius of 6.2 cm in TD direction, and thus the curling was apparently reduced. On the processed substrate was observed no curling in MD direction.

EXAMPLE 3

A circuit printable flexible substrate was prepared in the same manner as in Example 1. The so prepared substrate had a similar curling of a curvature radius of 4.5 cm in TD direction.

The process for removing curling described in Example 1 was repeated on the above substrate except that the bar was replaced with a glass bar having a curved surface of a curvature radius of 3.5 mm.

The substrate processed as above had substantially no curling in TD direction. On the processed substrate was observed light curling in MD direction.

EXAMPLE 4

A circuit printable flexible substrate was prepared in the same manner as in Example 1. The so prepared substrate had a similar curling of a curvature radius of 4.4 cm in TD direction.

The process for removing curling described in Example 1 was repeated on the above substrate except that the load placed on the end portion of the substrate was replaced with a load of 1006.5 g.

The substrate processed as above had curling of a curvature radius of 10.6 cm in TD direction, and thus the curling was apparently reduced. On the processed substrate was observed no curling in MD direction.

EXAMPLE 5

A circuit printable flexible substrate having the resin film layer of a thickness approx. 40 μm was prepared in the same manner as in Example 1. The so prepared substrate had a similar curling of a curvature radius of 3.8 cm in TD direction.

The process for removing curling described in Example 1 was repeated.

The substrate processed as above had curling of a curvature radius of 6.5 cm in TD direction, and thus the curling was apparently reduced. On the processed substrate was observed no curling in MD direction.

EXAMPLE 6

To 117 g. of N-methyl-2-pyrrolidone were added 15.27 g. (0.07 mol.) of pyromellitic acid dianhydride amd 14.02 g. (0.07 mol.) of 4,4'-diaminediphenyl ether. The resulting mixture was subjected to reaction for 24 hours to obtain an aromatic polyamic acid solution having a concentration of 20% by weight of the polymer and a logarithmic viscosity of 0.96.

The so obtained aromatic polyamic acid solution was casted on an electrolytic copper foil (MD direction: 14 cm×TD direction: 14 cm, thickness: 35 μm) at approx. 100° C. and then heated to 120° C. for 2 hours by means of a hot blast dryer to remove the solvent. Subsequently, the polymer in the casted layer was imidized by heating at 300° C. for 30 minutes to obtain a circuit printable flexible substrate having an aromatic polyimide film layer having a thickness of 25 μm. The obtained substrate had curling having a curvature radius of 1.8 cm in TD direction, with the metal foil facing outside.

The process for removing curling described in Example 1 was repeated on the above substrate except that the bar was replaced with a glass bar having a curved surface of a curvature radius of 2.5 mm and the sliding was made in TD direction.

The substrate processed as above had curling having a curvature radius of 8.5 cm in TD direction, with the copper foil facing inside. On the processed substrate wa also observed curling of a curvature radius of 7.6 cm in MD direction.

The process for removing curling described above was again repeated on the above-processed substrate except that the bar was replaced with a glass bar having a curved surface of a curvature radius of 6.25 mm and the substrate was run in MD direction.

The substrate processed as above had substantially no curling in TD direction, as well as in MD direction.

EXAMPLE 7

A circuit printable flexible substrate having the resin film layer of a thickness of approx. 25 μm was prepared in the same manner as in Example 6, except that a commercially available aromatic polyamideimide varnish prepared from trimellitic anhydride and 4,4'-diaminodiphenylmethane was employed. The so prepared substrate had a similar curling of a curvature radius of 2.6 cm in TD direction.

The process for removing curling described in Example 1 was repeated except that the bar was replaced with a bar having a curved surface of a curvature radius of 2.0 mm.

The substrate processed as above had curling of a curvature radius of 6.8 cm in TD direction, and thus the curling was apparently reduced. On the processed substrate was observed no curling in MD direction.

EXAMPLE 8

To 1146 g. of 4-chlorophenol were added 73.56 g. (0.25 mol.) of 3,3',4,4'-biphenyltetracarboxylic acid dianhydride and 50.06 g. (0.25 mol.) of 4,4'-diaminodiphenyl ether, and the mixture was heated under stirring to reach 180° C. for one hour. Subsequently, the resulting solution was kept at a temperature of 180° C. for one hour to carry out polymerization-imidization reaction to obtain an aromatic polyimide solution. The logarithmic viscosity of the produced aromatic polyimide was 2.28.

The aromatic polyimide solution was then casted on a rolled copper foil (MD direction: 24 cm×TD direction: 14 cm, thickness: 35 μm) at approx. 100° C., and heated to approx. 140° C. for one hour under reduced pressure to remove most of the solvent. The casted layer was subsequently heated to 300° C. to obtain a circuit printable flexible substrate having an aromatic polyimide film layer (thickness: 25 μm) and containing substantially no solvent.

The substrate was further heated to 300° C. for 12 hours so as to have the copper foil annealed and recrystallized.

The so processed substrate had, in the TD direction, curling (curvature radius: 4.1 cm) which curled to direct the metal foil to face outside.

The process for removing curling described in Example 1 was repeated except that the load placed on the end of the substrate was replaced with a load of 1 kg. and the bar was replaced with a bar having a curved surface of a curvature radius of 7.5 mm.

The substrate processed as above had curling of a curvature radius of 13.5 cm in TD direction, and thus the curling was apparently reduced. On the processed substrate was observed no curling in MD direction.

EXAMPLE 9

To 1146 g. of 4-chlorophenol were added 73.56 g. (0.25 mol.) of 3,3',4,4'-biphenyltetracarboxylic acid dianhydride and 50.06 g. (0.25 mol.) of 4,4'-diaminodiphenyl ether, and the mixture was heated under stirring to reach 180° C. for one hour. Subsequently, the resulting solution was kept at a temperature of 180° C. for one hour to carry out polymerization-imidization reaction to obtain an aromatic polyimide solution. The so obtained aromatic polyimide solution had a viscosity of approx. 5,000 at 100° C., according to a rotating vicometer measurement.

The aromatic polyimide solution was defoamed and then extruded continuously from a T die (slit clearance: 0.28 mm) on a continuous electrolytic copper foil (width: 25 cm, thickness: 35 μm) supported on a steel belt to form a coating layer. The layer was then heated by air of 115°-200° C. to remove approx. 80% by weight of the solvent, producing a film layer thereon. The film layer was subsequently heated to 400° C. in a high temperature dryer for a short time to obtain a circuit printable continuous flexible substrate having an aromatic polyimide film layer (thickness: 25 μm).

The so obtained substrate had, in the TD direction, curling (curvature radius: 5.5 cm) which curled to direct the metal foil to face outside. In the longitudinal direction (MD direction), no curling was observed.

However, curling having a curvature radius of 5.8 cm appeared on the substrate in the MD direction when the continuous substrate was cut to give a square piece (25 cm×25 cm).

A process for removing the curling was carried out by placing a load of 2 kg. at the end portion of the continuous substrate, and sliding the substrate in the following two stages:

the first stage of sliding in the longitudinal direction (MD direction) the continuous substrate on a curved suface (curvature radius: 6.25 mm) of a first bar made of glass fixed at an angle of 45° against the width direction (TD direction) of the supplied continuous substrate (as is illustrated in FIG. 1), turning aside the substrate at the first bar at a turning angle of 180°; and the second stage of sliding continuously in the longitudinal direction (MD derection) the continuous substrate on a curved suface (curvature radius: 11.0 mm) of a second bar made of glass fixed at an angle of 90° against the first bar (as is illustrated in FIG. 1), turning back the substrate at the second bar at a turning angle of 180°.

The sliding procedure was done at room temperature and at a running speed of 45 cm/min., placing the surface of copper foil inside to keep the copper foil surface in contact with the bars.

The continuous substrate processed as above was substantially free from curling in TD direction, and no curling was observed in MD direction (longitudinal direction). Also no curling was observed in both directions when the continuous substrate was cut to give a square piece (25 cm×25 cm).

EXAMPLE 10

To 117 g of N-methyl-2pyrrolidone were added 15.27 g. (0.07 mol.) of pyromellitic acid dianhydride and 14.02 g. (0.07 mol.) of 4,4'-diaminodiphenyl ether. The resulting mixture was subjected to reaction for 24 hours to obtain an aromatic polyamic acid solution having a concentration of 20% by weight of the polymer and a viscosity of approx. 4,000 poise at 100° C. according to a rotating viscosity measurement.

A continuous substrate having an aromatic polyimide layer of a thickness of 25 μm was prepared in the same manner as in Example 9 except that the aromatic polyamic acid solution obtained above was employed.

The obtained continuous substrate had curling having a curvature radius of 1.8 cm in TD direction, with the metal foil facing outside. In the longitudinal direction (MD direction), no curling was observed. However, curling having a curvature radius of 2.1 cm appeared on the substrate in the MD direction when the continuous substrate was cut to give a square piece (25 cm×25 cm).

The two stage process for removing curling described in Example 9 was repeated on the above continous substrate except that the load placed on the end of the continuous substrate was replaced with a load of 3 kg., that the first bar and the second bar were replaced with glass bars having curved surfaces of curvature radii of 2.5 mm for both, and that the sliding was carried out at a speed of 101 cm/min.

The continuous substrate processed as above was substantially free from curling in TD direction, and no curling was observed in MD direction (longitudinal direction). When the continuous substrate was cut to give a square piece (25 cm×25 cm), light curlings such as curvature radii of 13.8 cm in TD direction and 10.9 cm in MD direction were observed.

EXAMPLE 11

A circuit printable continuous flexible substrate having the polyamideimide film layer of a thickness of approx. 25 μm was prepared in the same manner as in Example 9, except that a commercially available aromatic polyamideimide varnish prepared from trimellitic anhydride and 4,4'-diaminodiphenylmethane was employed, and the heating procedure at approx. 115°–200° C. for removing most of the solvent was replaced with a heating procedure at 120° C. The so prepared continuous substrate had a similar curling of a curvature radius of 2.6 cm in TD direction.

The two stage process for removing curling described in Example 10 was repeated. The continuous substrate processed as above was substantially free from curling in TD direction, and no curling was observed in MD direction (longitudinal direction). Also no curling was observed in both directions when the continuous substrate was cut to give a square piece (25 cm×25 cm).

We claim:

1. A method for continuously removing curl from a circuit printable continuous flexible elongated substrate, the substrate having longitudinal and width directions and comprising a copper foil and a film layer of an aromatic polyamideimide or an aromatic polyimide which was formed by coating a layer of a solution of (i) an aromatic polyamideimide, (ii) an aromatic polyimide precursor or (iii) an aromatic polyimide on said copper foil, and drying the coated solution layer to cause it to set whereby the copper foil surface curls outwardly in the direction of the coated surface thereof, the method comprising:

moving under tension the curled coated continuous flexible substrate in the longitudinal direction thereof;

passing and sliding said moving coated curled substrate, under a tension force of 15 to 200 grams per 1 cm of width of the substrate, over a curved surface with said metal foil layer being in contact with said curved surface, said curved surface having a radius of curvature of 1 to 10 mm, said substrate sliding over and relative to said curved surface while passing thereover, the relative sliding speed being within the range of 3–300 cm/min.;

turning said substrate around said curved surface at a turning angle of not less than 90°; and maintaining the temperature during said passing and sliding step to be no higher than 80° C.

2. The method of claim 1, wherein said turning angle is not less than 135°.

3. The method of claim 1, wherein said curved surface is a curved outer surface of an elongated bar, the radius of curvature radius of the portion of said bar defining said curved surface ranging from 1 to 10 mm.

4. The method of claim 1, wherein said copper foil is a rolled copper foil.

5. The method of claim 1, wherein said copper foil has a thickness ranging from 10 to 100 μm.

6. The method of claim 1, wherein said film layer has a thickness ranging from 10 to 150 μm.

7. The method of claim 1, wherein said radius of curvature of said curved surface ranges from 2 to 6 mm.

8. The method of claim 3, wherein the radius of curvature of said portion of said bar defining said curved surface ranges from 2 to 6 mm.

9. The method of claim 1, wherein the temperature during said passing and sliding step is within a range of 0° to 50° C.

10. The method of claim 1, wherein said curved surface extends in a given direction at an angle of 20°–70° relative to the width direction of said substrate.

11. The method of claim 1, wherein said curved surface is defined by an elongated bar which is rotatable about its longitudinal axis, and comprising rotating said bar at a circumferential speed different from the speed of movement of said substrate thereover during said passing and sliding step, thereby obtaining relative sliding between said moving substrate and the surface of said bar.

12. A method for continuously removing curl from a circuit printable continuous flexible elongated substrate, the substrate having longitudinal and width directions and comprising a metal foil and a film layer of an aromatic polyamideimide or an aromatic polyimide which was formed by coating a layer of a solution of (i) an aromatic polyamideimide, (ii) an aromatic polyimide precursor or (iii) an aromatic polyimide on said metal foil, and drying the coated solution layer to cause it to set whereby the metal foil surface curls outwardly in the direction of the coated surface thereof, the method comprising:
moving under tension the curled coated continuous flexible substrate in the longitudinal direction thereof;

passing and sliding said moving coated substrate under tension over a first curved surface with said metal foil layer being in contact with said first curved surface, said first curved surface having a radius of curvature of 0.5–25 mm and said first curved surface extending in a given direction at an angle of 20°–70° relative to the width direction of said substrate, said substrate sliding over and relative to said first curved surface while passing thereover, and turning said substrate around said first curved surface at a turning angle of not less than 90°, and the temperature during said passing step being no higher than 80° C.; and passing and sliding said moving coated substrate under tension over a second curved surface after leaving said first curved surface, and with said metal foil layer being in contact with said second curved surface, said second curved surface having a radius of curvature of 0.5–25 mm and said second curved surface extending in a given direction at an angle of 70°–110° relative to the width direction of said substrate, said substrate sliding over and relative to said second curved surface while passing thereover, and turning said substrate around said second curved surface at a turning angle of not less than 90°, and the temperature during said passing of said substrate over said second curved surface being no higher than 80° C.

13. The method of claim 12, wherein said turning angles over said first and second curved surfaces are not less than 135°.

14. The method of claim 12, wherein the angle of said second curved surface against said first curved surface ranges from 80° to 100°.

15. The method of claim 12, wherein said radius of curvature of each of said first and second curved surfaces ranges from 1 to 10 mm.

16. The method of claim 15, wherein said first and second curves surfaces are defined by a respective elongated bar having said defined radius of curvature.

17. The method of claim 12, wherein said first and second curved surfaces are defined by a respective elongated bar having said defined radius of curvature.

18. The method of claim 12, wherein said metal foil is a rolled copper foil.

19. The method of claim 12, comprising maintaining said tension of said curled coated flexible substrate, at said second curved surface, at a tension force of 10 to 100 grams per 1 cm of width of said substrate.

20. The method of claim 12, wherein the relative sliding speed between said substrate and said first and second curved surfaces is within the range of 3–300 cm/min.

21. The method of claim 12, wherein said first and second curved surfaces are defined by respective elongated bars which are rotatable about their respective longitudinal axes, and comprising rotating said bars at a circumferential speed different from the speed of movement of said substrate thereover during said passing and sliding step so that the relative sliding speed between said substrate and said bars is within the range of 3–300 cm/min.

22. The method of claim 1, wherein said curved surface is a stationary curved surface.

23. The method of claim 12, wherein said first and second curved surfaces are stationary curved surfaces.

* * * * *